United States Patent
Mar

(10) Patent No.: US 7,450,680 B2
(45) Date of Patent: Nov. 11, 2008

(54) FRACTIONAL-N DIVIDER CONFIGURABLE AS A POLYNOMIAL FUNCTION FOR REAL-TIME PLL SWEPT FREQUENCY APPLICATIONS

(75) Inventor: Wing J. Mar, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 201 days.

(21) Appl. No.: 11/550,860

(22) Filed: Oct. 19, 2006

(65) Prior Publication Data

US 2008/0094144 A1 Apr. 24, 2008

(51) Int. Cl.
*H03K 21/00* (2006.01)
*H03K 23/00* (2006.01)

(52) U.S. Cl. .......................................... 377/47; 377/48
(58) Field of Classification Search ................... 377/47, 377/48

See application file for complete search history.

(56) References Cited

U.S. PATENT DOCUMENTS

| | | | |
|---|---|---|---|
| 6,236,703 B1 * | 5/2001 | Riley | 377/48 |
| 6,353,649 B1 * | 3/2002 | Bockleman et al. | 375/376 |
| 6,614,813 B1 * | 9/2003 | Dudley et al. | 370/532 |
| 2007/0211819 A1 * | 9/2007 | Greenberg | 375/295 |

* cited by examiner

*Primary Examiner*—Tuan T Lam
(74) *Attorney, Agent, or Firm*—Pamela L. Kee

(57) ABSTRACT

This invention adds a non-linear sweep accumulator to the conventional sigma-delta fractional-N divider to produce a N.F value that is a polynomial function of time. This allows any non-linear sweep profiles to be approximated.

4 Claims, 3 Drawing Sheets

FRACTIONAL-N DIVIDER CONFIGURABLE AS A POLYNOMIAL FUNCTION FOR REAL-TIME PLL SWEPT FREQUENCY APPLICATIONS

BACKGROUND

Synthesized frequency sweeps based on fractional-N phase locked loops (PLL) can achieve accurate frequency sweeps. This method of signal generation is preferred in certain applications due to some of its desirable attributes such as accuracy, frequency range, spur level, and power consumption. When a traditional fractional-N divider is used, the output frequency is either proportional to time or reciprocal of time, respectively, depending on whether the fractional-N divider is used in the feedback path or as the reference divider. With the new fractional-N divider of this invention, the fractional divide ratio is a function of polynomials to allow changing the frequency profile through its coefficients.

When this new fractional-N divider is used in the feedback path of a PLL, the output frequency profile changes from a linear function of time to that of a polynomial function of time, allowing non-linear frequency profiles to be produced. When this new fractional-N divider is used as the reference divider of a PLL, its polynomial coefficients can be used to linearize the output frequency profile.

The traditional methods of non-linear synthesized sweeps are linear piece-wise approximation and point-to-point steeping from a frequency list.

In the case of sweep linearization, the traditional method is piece-wise approximation with small enough spans to minimize linearization error.

Certain applications tolerate sweep non-linearity using post-processing correction, which is a data processing method rather than a signal generation method.

SUMMARY

This invention provides fast real-time generation of non-linear sweeps. It can also be used to provide real-time correction of non-linear sweep from a divided signal.

This invention adds a non-linear sweep accumulator to the conventional sigma-delta fractional-N divider to produce a N.F value that is a polynomial function of time. This allows any non-linear sweep profiles to be approximated.

DETAILED DESCRIPTION

This invention adds a non-linear sweep accumulator to the conventional sigma-delta fractional-N divider to produce a N.F value that is a polynomial function of time. This allows any non-linear sweep profiles to be approximated.

Figure 1:
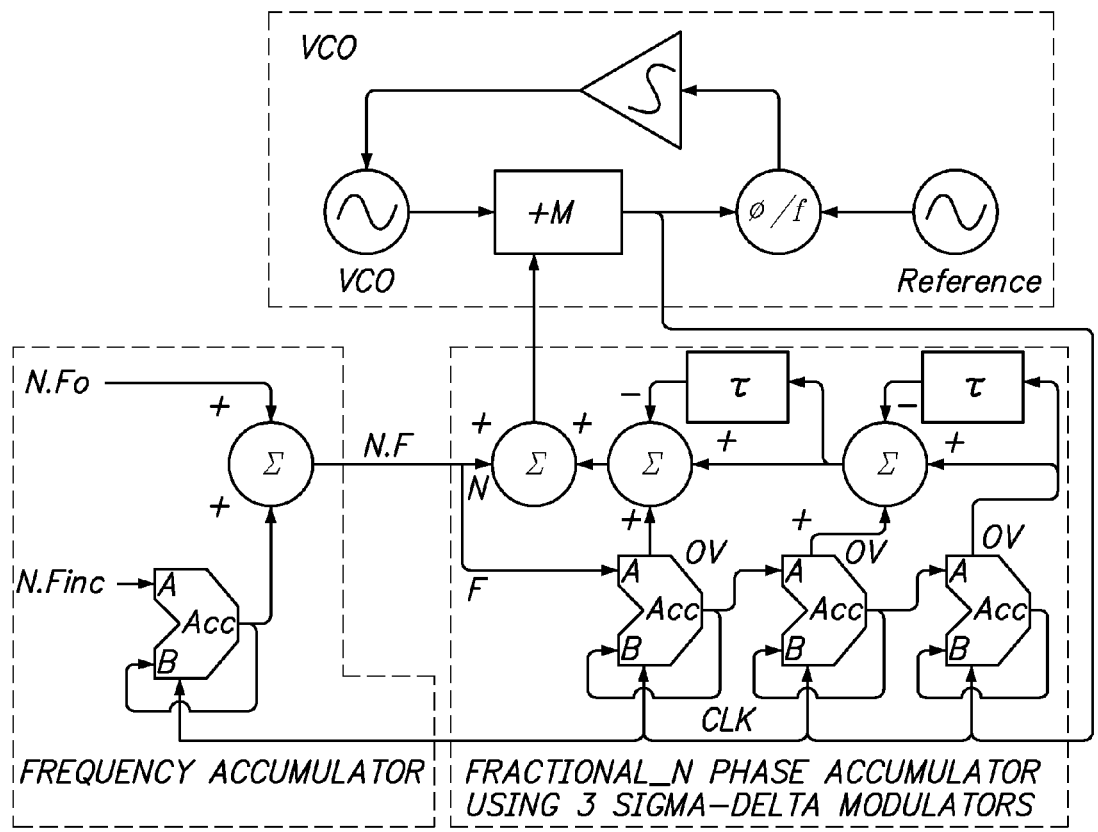
FIG. 1 illustrates a phase lock loop of the prior art.

FIG. 1 shows a conventional single-loop phase locked loop (PLL) with linear sweep (prior art). Fractional division is produced by modulating the integer divider around its nominal value of N such that the time-averaged divide ratio is N.F. The modulation is controlled by multiple sigma-delta modulators for noise shaping to allow the loop filter to easily remove the resultant dither noise. When the loop is locked, the VCO frequency has the frequency of N.F times the reference frequency. The theory of operation for this type of factional divider can be found from the paper "A Multiple Modulator Fractional Divider" by Brian Miller and Robert Conley in *IEEE Transactions on Instrumentation and Measurement*, Vol. 40, No. 3, June 1991.

A frequency accumulator is used to produce a N.F that is equal to $N.F_o + i*N.F_{inc}$, where $N.F_o$ is a start value, $N.F_{inc}$ is an increment value, and i is the number of transpired clock cycles. The resultant PLL produces a VCO frequency sweep that starts at $N.F_o$ times the reference frequency and increments by $N.F_{inc}$ times the reference frequency every cycle of the reference frequency. The fractional-N PLL thus produces a linear sweep from the VCO, even when the tuning characteristic of the VCO is non-linear.

There are many applications where a non-linear sweep is desired. A logarithmic sweep, for example, is often used in audio frequency measurements. A non-conventional use of the fractional-N divider as described in U.S. Pat. No. 6,636,086—High Performance Microwave Synthesizer Using Multiple Modulator Fractional-N Divider can greatly benefit from this invention. The latter application, in which the fractional-N divider is used to divide a fixed high-frequency reference to produce a low frequency interpolation signal for an offset PLL, suffers from non-linear sweeps since the output frequency is proportional to 1/N.F. The invention, in this case, can be used to compensate for the sweep non-linearity.

When a conventional fractional divider is used to produce a swept interpolation signal, for example, over the range of 35 to 55 MHz from a high frequency reference signal of 4800 MHz, the $N.F_{start}$ is equal to 4800/35=137.1 and $N.F_{stop}$ is equal to 4800/55=87.27. Since the average frequency is 45 MHz, the average frequency increment cycle period is 22.2 ns. If the sweep time to cover the above range is 1 ms, the number of frequency increment steps is approximately 1 ms/22.2 ns=45000. The frequency increment $N.F_{inc}$ is then computed to be $(N.F_{stop} - N.F_{start})/\#Steps = -0.011073$. Note that in additional to the non-linearity due to the 1/N.F frequency relationship, the frequency increment occurs at the output frequency rate, resulting in a secondary non-linear effect that complicates the exact computation of $N.F_{inc}$. Both effects are minimized by limiting the range of the frequency span. By combining small spans to form a larger piece-wise linear span, any linearity can theoretically be achieved.

Figure 2:
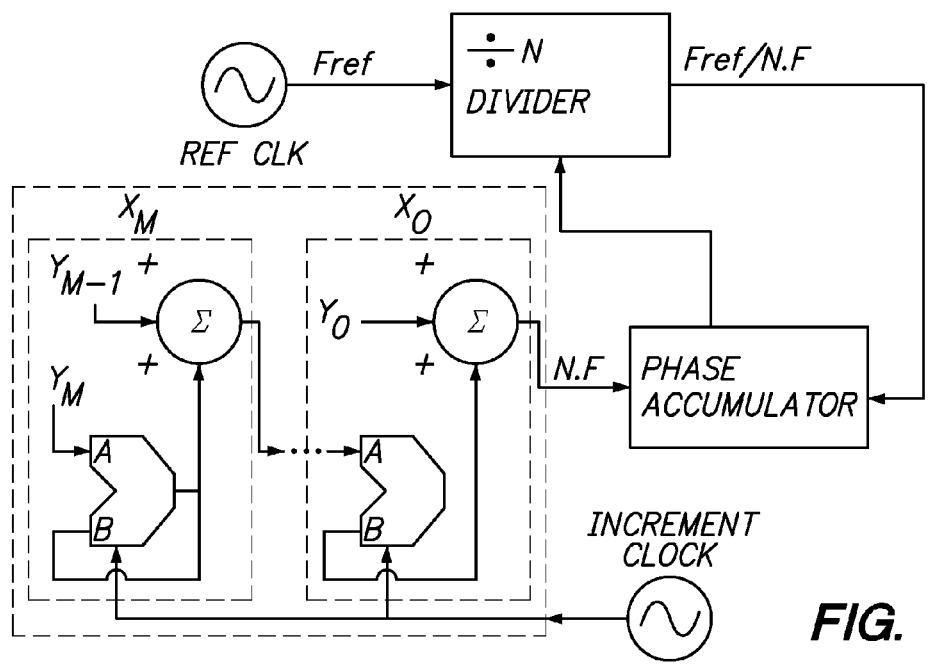
FIG. 2 illustrates a functional block diagram according to the invention.

FIG. 2 illustrates a functional block diagram according to the invention. A frequency divider receives an input from a high frequency reference clock and a phase accumulator. The output of the frequency divider provides the clock signal for the phase accumulator. A frequency accumulator receives an input from an incremental clock. The output of the frequency accumulator is received as an input to the phase accumulator.

Figure 3:
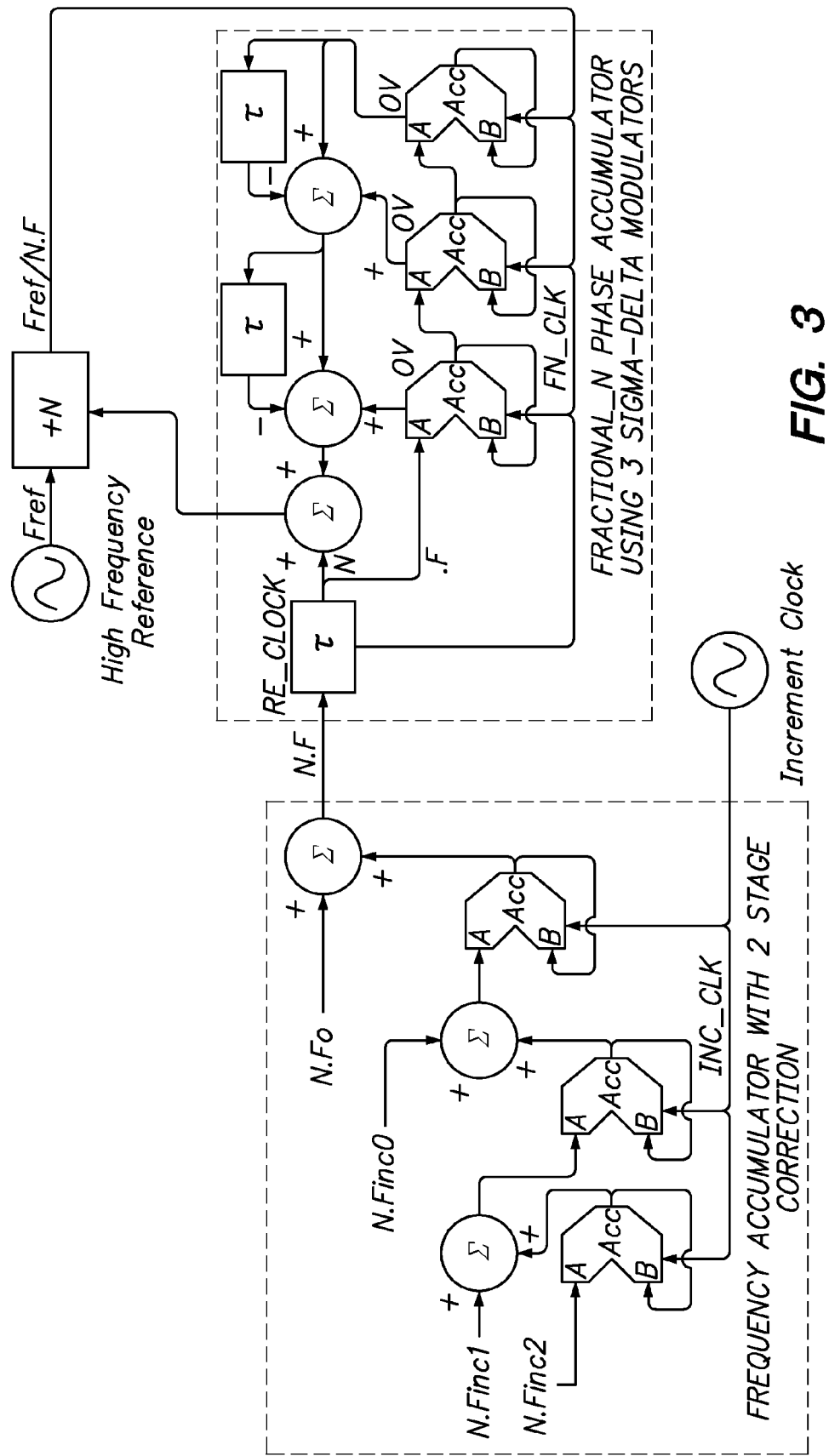
FIG. 3 illustrates an embodiment of the invention.

FIG. 3 illustrates an embodiment of the invention with a 2-stage correction frequency accumulator. Additional stages can be added to provide higher order corrections as needed. For each stage of correction, an additional accumulator and summer is added. The resultant N.F is $$N.F = c_0 + c_1 \cdot i + c_2 \cdot i^2 + c_3 \cdot i^3 + \ldots \qquad \text{Equation 1}$$

In the case of the interpolation signal, the task is to compute the coefficient values of $c_0$, $c_1$, $c_2$ etc. to achieve the most linear sweep over the specified span.

One other significant change is to de-couple the fractional-N clock, which is derived from the output of the fractional divider, from the frequency increment clock. Since N.F is now updated at the fixed increment clock rate and sampled at the varying fractional-N clock rate, a re-clock functional block is needed to avoid metastability from the N.F samples before being used by the sigma-delta modulators.

The fixed-frequency increment clock greatly simplifies the analysis of the interpolation signal by precisely fixing the number of increment cycles. Thus a sweep time of 0.1 ms with an increment clock of 10 MHz requires precisely 1000 increments. The increment clock frequency should be high enough in frequency to provide good increment resolution but lower than the minimum output frequency of the interpolation signal to ensure that each increment step is sampled by the fractional-N clock.

In a conventional PLL application where the VCO frequency is N.F times the reference frequency. The N.F value that is a polynomial function of time can simply be mapped to frequency swept profile expressed as a polynomial.

In the interpolation signal application, it is generally easier to pick specific points for matching the actual output frequency against the desired frequencies using linear algebra. For an interpolation signal produced from a 3-stage correction frequency accumulator, the interpolation frequency at the i-th increment step from dividing a high frequency signal $f_R$ is given as $$f_i = \frac{f_R}{c_0 + c_1 \cdot i + c_2 \cdot i^2 + c_3 \cdot i^3} \qquad \text{Equation 2}$$

Rewriting the equation above, we have $$i \cdot c_1 + i^2 \cdot c_2 + i^3 \cdot c_3 = \frac{f_R}{f_i} - c_0 = \frac{f_R}{f_i} - \frac{f_R}{f_{start}} \qquad \text{Equation 3}$$

For the above 3-stage correction frequency accumulator, four frequency points across the span can be specified. The starting point is fixed by $C_0$. Three other points can be fixed via the coefficients $c_1$, $C_2$, and $c_3$. The three frequency points occurring at increment interval i, j, and k would result in following three equations:

$$i \cdot c_1 + i^2 \cdot c_2 + i^3 \cdot c_3 = \frac{f_R}{f_i} - \frac{f_R}{f_{start}} \qquad \text{Equation 4}$$

$$j \cdot c_1 + j^2 \cdot c_2 + j^3 \cdot c_3 = \frac{f_R}{f_j} - \frac{f_R}{f_{start}} \qquad \text{Equation 5}$$

$$k \cdot c_1 + k^2 \cdot c_2 + k^3 \cdot c_3 = \frac{f_R}{f_k} - \frac{f_R}{f_{start}} \qquad \text{Equation 6}$$

In matrix form, we have $$\begin{bmatrix} i & i^2 & i^3 \\ j & j^2 & j^3 \\ k & k^2 & k^3 \end{bmatrix} \cdot \begin{bmatrix} c_1 \\ c_2 \\ c_3 \end{bmatrix} = \begin{bmatrix} \frac{f_R}{f_i} - \frac{f_R}{f_{start}} \\ \frac{f_R}{f_j} - \frac{f_R}{f_{start}} \\ \frac{f_R}{f_k} - \frac{f_R}{f_{start}} \end{bmatrix} \qquad \text{Equation 7}$$

The matrix form offers a convenient method of computing as large a number of correction points as necessary. The limitation will be the additional hardware requirements for the additional correction stages, not the complicity of computing the coefficients.

The described functionality may be incorporated into the same FPGA (field-programmable gate array) or ASIC (application specific integrator circuit) that contains the fractional-N sigma-delta engine. The incremental cost to add the frequency correction stages is thus quite low.

Figure 4:
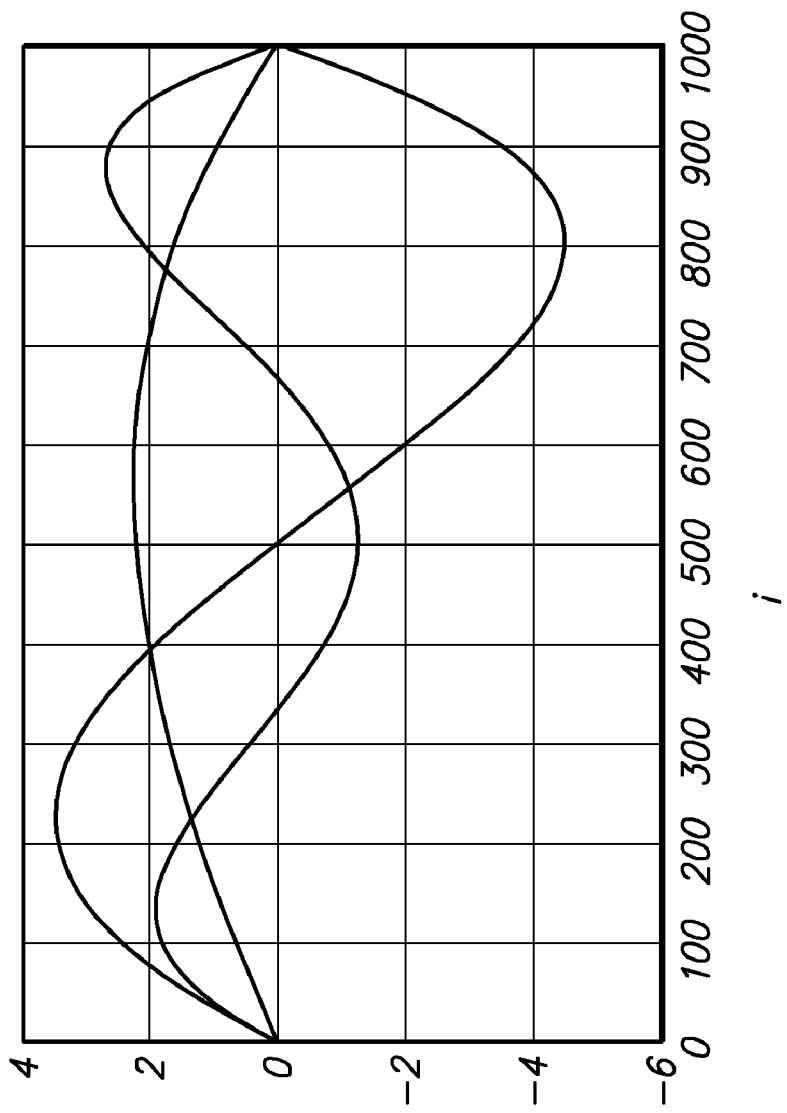
FIG. 4 is a chart showing the improvement to linearity using the invention.

FIG. 4 is a plot that shows the improvement to linearity with this invention where a 35 to 55 MHz swept interpolation signal is derived by dividing a 4800 MHz reference signal with 1000 increment steps.

The red trace is that with no correction, resulting in $NF_0$ setting the start frequency and $NF_{inc}$ setting the stop frequency with maximum frequency error of about 2.3 MHz in between. The peak-to-peak linearity error in this case is about 11.5% of the 20 MHz span.

The blue trace is that with a 1-stage correction frequency accumulator, allowing the middle frequency point to also be set. The trace is scaled by 20 for easier comparison. The peak-to-peak linearity error is 0.4 MHz, which is 2% of span.

The black trace is that with a 2-stage correction frequency accumulator, allowing the frequency points at 33.3% and 66.6% of the span to be set. The trace is scaled by 100 for easy comparison. The peak-to-peak linearity error is about 0.04 MHz, which is 0.2% of the 20 MHz span.

The inherent speed of real-time non-linear frequency sweeps enables applications that are not possible previously.

As an example, while it is possible to stitch 50 or so 400 kHz-wide frequency spans to form the 35 to 55 MHz interpolation signal without using this invention to achieve the same 0.2% span linearity as the 2-stage correction frequency accumulator, processing and sequencing the small spans will be time consuming that certain time critical measurements will not be possible.

To derive the relationship between the polynomial coefficients and the input values $N.F_{inc0}, N.F_{inc1}, \ldots N.F_{inck}$, let's denote $N.F_0$ as $X_0$ and $N.F_{inci}$ as $X_{i-1}$.

For the case of the 3-stage correction where k=3, the output of the left-most accumulator with $X_3$ as its input after N samples is given as $$ACC_3 = \sum_{i=1}^{N} X_3 = X_3 \cdot N \qquad \text{Equation 8}$$

The output of the second accumulator with its input being the sum of $ACC_3$ and $X_2$ after N samples is given as $$ACC_2 = \sum_{i=1}^{N} [ACC_3 + X_2] = \sum_{i=1}^{N} [X_3 \cdot i + X_2] \qquad \text{Equation 9}$$

$$= X_3 \cdot \left(\frac{N^2}{2} + \frac{N}{2}\right) + X_2 \cdot N = \frac{X_3}{2} \cdot N^2 + \left(\frac{X_3}{2} + X_2\right) \cdot N$$

The output of the third accumulator with its input being the sum of $ACC_2$ and $X_1$ after N samples is given as $$ACC_1 = \sum_{i=1}^{N} [ACC_2 + X_1] \qquad \text{Equation 10}$$

-continued $$= \sum_{i=1}^{N} \left[ \frac{X_3}{2} \cdot i^2 + \left( \frac{X_3}{2} + X_2 \right) \cdot i + X_1 \right]$$

$$= \frac{X_3}{2} \cdot \left( \frac{N^3}{3} + \frac{N^2}{2} + \frac{N}{6} \right) + \left( \frac{X_3}{2} + X_2 \right) \cdot \left( \frac{N^2}{2} + \frac{N}{2} \right) + X_1 \cdot N$$

$$= \frac{X_3}{6} \cdot N^3 + \left( \frac{X_3}{2} + \frac{X_3}{2} + X_2 \right) \cdot \frac{N^2}{2} + \left( \frac{X_3}{12} + \frac{X_3}{4} + \frac{X_2}{2} + X_1 \right) \cdot N$$

$$= \frac{X_3}{6} \cdot N^3 + \left( \frac{X_3 + X_2}{2} \right) \cdot N^2 + \left( \frac{X_3}{3} + \frac{X_2}{2} + X_1 \right) \cdot N$$

The $X_0$ term is added to the output of $ACC_1$ to produce the N.F value after N samples of $$N.F = ACC_1 + X_0 \quad \text{Equation 11}$$

$$= \frac{X_3}{6} \cdot N^3 + \left( \frac{X_3 + X_2}{2} \right) \cdot N^2 + \left( \frac{X_3}{3} + \frac{X_2}{2} + X_1 \right) \cdot N + X_0$$

The polynomial coefficients for the 3-stage correction are thus $$c_0 = X_0 = N.F_0 \quad \text{Equation 12}$$
$$c_1 = \frac{X_3}{3} + \frac{X_2}{2} + X_1 = \frac{N.F_{inc2}}{3} + \frac{N.F_{inc1}}{2} + N.F_{inc0}$$
$$c_2 = \frac{X_3 + X_2}{2} = \frac{N.F_{inc2} + N.F_{inc1}}{2}$$
$$c_3 = \frac{X_3}{6} = \frac{N.F_{inc2}}{6}$$

For a given sweep profile, the polynomial coefficients are first computed. The N.F input values are then mapped to the coefficients.

As an example, taking the simple case of a 2-stage correction polynomial where the i-th sample of the N.F value is given by $$N.F_i = X_2 \cdot \left( \frac{i^2}{2} + \frac{i}{2} \right) + X_1 \cdot i + X_0 \quad \text{Equation 13}$$

$$= \frac{X_2}{2} \cdot i^2 + \left( \frac{X_2}{2} + X_1 \right) \cdot i + X_0$$

$$= c_2 \cdot i^2 + c_1 \cdot i + c_0$$

where the polynomial coefficients are $$c_0 = X_0 = N.F_0 \quad \text{Equation 14}$$
$$c_1 = \frac{X_2}{2} + X_1 = \frac{N.F_{inc1}}{2} + N.F_{inc0}$$
$$c_2 = \frac{X_2}{2} = \frac{N.F_{inc1}}{2}$$

At i=0, the N.F divided output frequency from $f_R$ is $f_{start}$ $$f_{start} = \frac{f_R}{N.F_0} = \frac{f_R}{c_2 \cdot 0^2 + c_1 \cdot 0 + c_0} = \frac{f_R}{c_0} = \frac{f_R}{N.F_0} \quad \text{Equation 15}$$

At the last sample of i=M, the N.F divided output frequency from $f_R$ is $f_{stop}$ $$f_{stop} = \frac{f_R}{N.F_M} = \frac{f_R}{c_2 \cdot M^2 + c_1 \cdot M + c_0} \quad \text{Equation 16}$$

At the middle sample of i=M/2, the N.F divided output frequency from $f_R$ is $f_{mid}$ $$f_{mid} = \frac{f_{start} + f_{stop}}{2} = \frac{f_R}{N.F_{\frac{M}{2}}} = \frac{f_R}{c_2 \cdot \frac{M^2}{4} + c_1 \cdot \frac{M}{2} + c_0} \quad \text{Equation 17}$$

Solving for $c_2$ $$c_2 = \left[ \frac{2 \cdot f_R}{f_{start} + f_{stop}} - c_1 \cdot \frac{M}{2} - c_0 \right] \cdot \frac{4}{M^2} \quad \text{Equation 18}$$

Substituting into the equation for $f_{stop}$ above $$f_{stop} = \frac{f_R}{c_2 \cdot M^2 + c_1 \cdot M + c_0} \quad \text{Equation 19}$$

$$= \frac{f_R}{\left[ \frac{2 \cdot f_R}{f_{start} + f_{stop}} - c_1 \cdot \frac{M}{2} - c_0 \right] \cdot \frac{4}{M^2} \cdot M^2 + c_1 \cdot M + c_0}$$

Re-arranging the equation to solve for $c_1$ $$c_1 = \left[ \frac{8 \cdot f_R}{f_{start} + f_{stop}} - \frac{f_R}{f_{stop}} - 3 \cdot c_0 \right] \cdot \frac{1}{M} \quad \text{Equation 20}$$

Substituting $c_1$ into the equation for $c_2$ $$c_2 = \left[ \frac{2 \cdot f_R}{f_{start} + f_{stop}} - \left( \frac{\frac{8 \cdot f_R}{f_{start} + f_{stop}} - \frac{f_R}{f_{stop}} - 3 \cdot c_0}{} \right) \cdot \frac{1}{2} - c_0 \right] \cdot \frac{4}{M^2} \quad \text{Equation 21}$$

$$= \left[ \frac{f_R}{2 \cdot f_{stop}} + \frac{c_0}{2} - \frac{2 \cdot f_R}{f_{start} + f_{stop}} \right] \cdot \frac{4}{M^2}$$

Solving for the N.F values in terms of the given frequency values $$f_{start} = \frac{f_R}{c_0} = \frac{f_R}{N.F_0} \Rightarrow$$

$$N.F_0 = c_0 = \frac{f_R}{f_{start}}$$

Equation 22

$$c_2 = \left[\frac{f_R}{2 \cdot f_{stop}} + \frac{c_0}{2} - \frac{2 \cdot f_R}{f_{start} + f_{stop}}\right] \cdot \frac{4}{M^2} = \frac{N.F_{inc1}}{2} \Rightarrow$$

$$N.F_{inc1} = \left[\frac{f_R}{2 \cdot f_{stop}} + \frac{f_R}{2 \cdot f_{start}} - \frac{2 \cdot f_R}{f_{start} + f_{stop}}\right] \cdot \frac{8}{M^2}$$

Equation 23

$$c_1 = \left[\frac{8 \cdot f_R}{f_{start} + f_{stop}} - \frac{f_R}{f_{stop}} - 3 \cdot c_0\right] \cdot \frac{1}{M} =$$

$$\frac{N.F_{inc1}}{2} + N.F_{inc} \Rightarrow$$

$$N.F_{inc0} = \left[\frac{8 \cdot f_R}{f_{start} + f_{stop}} - \frac{f_R}{f_{stop}} - 3 \cdot \frac{f_R}{f_{start}}\right] \cdot \frac{1}{M} - \frac{N.F_{inc1}}{2}$$

Equation 24

I claim:

1. A circuit comprising:
   a reference clock generating a reference signal;
   a phase accumulator generating a phase signal;
   a frequency divider includes a sigma-delta modulator, receiving the reference signal and the phase signal, generating a frequency divided signal, wherein the phase accumulator receives the frequency divided signal;
   an incremental clock generating an incremental signal; and
   a frequency accumulator, receiving the incremental signal, generating a correction signal, wherein the phase accumulator receives the correction signal.

2. A circuit, as defined in claim 1, the frequency accumulator includes at least two stages, each stage, generating a stage output, including:
   an accumulator, receiving the incremental signal and one of the Mth value and Mth stage output, generating and receiving an accumulator output; and
   a summer, receiving a M−1th value and the accumulator output, generating the M−1th stage output.

3. A circuit, as defined in claim 2, wherein the M increment values are related to coefficients of a selected polynomial function in time.

4. A circuit, as defined in claim 3, wherein the circuit is one of an application specific integrated circuit and field programmable gate array.

\* \* \* \* \*